(12) United States Patent
Yang et al.

(10) Patent No.: US 8,993,218 B2
(45) Date of Patent: Mar. 31, 2015

(54) PHOTO RESIST (PR) PROFILE CONTROL

(71) Applicants: Li Huai Yang, Zhubei (TW);
Chien-Mao Chen, Zhubei (TW)

(72) Inventors: Li Huai Yang, Zhubei (TW);
Chien-Mao Chen, Zhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 46 days.

(21) Appl. No.: 13/771,497

(22) Filed: Feb. 20, 2013

(65) Prior Publication Data

US 2014/0234772 A1 Aug. 21, 2014

(51) Int. Cl.
| G03F 7/11 | (2006.01) |
| G03F 7/36 | (2006.01) |
| H01L 21/027 | (2006.01) |
| G03F 7/00 | (2006.01) |
| G03F 7/095 | (2006.01) |
| G03F 7/20 | (2006.01) |
| G03F 7/42 | (2006.01) |
| G06F 7/36 | (2006.01) |
| H01L 21/311 | (2006.01) |
| H01L 21/04 | (2006.01) |
| H01L 21/768 | (2006.01) |

(52) U.S. Cl.
CPC .............. *G03F 7/0035* (2013.01); *G03F 7/095* (2013.01); *G03F 7/2024* (2013.01); *G03F 7/0037* (2013.01); *G03F 7/426* (2013.01); *G06F 7/36* (2013.01); *H01L 21/0271* (2013.01); *H01L 21/31138* (2013.01); *H01L 21/0274* (2013.01); *H01L 21/0279* (2013.01); *H01L 21/041* (2013.01); *H01L 21/76802* (2013.01); *G03F 7/11* (2013.01)

USPC ............. 430/314; 430/270.1; 430/272.1; 430/322; 430/325; 430/329; 430/331; 430/313; 430/311; 430/317; 430/312

(58) Field of Classification Search
CPC ..... G03F 7/0035; G03F 7/0037; G03F 7/091; G03F 7/095; G03F 7/11; G03F 7/42; G03F 7/426; G03F 7/36; H01L 21/31138; H01L 21/76802; H01L 21/0274; H01L 21/0279; H01L 21/0271; H01L 21/0273; H01L 21/332; H01L 21/227; H01L 21/041; H01L 21/274; H01L 21/279; H01L 21/041
USPC ........ 430/270.1, 271.1, 272.1, 313, 314, 317, 430/322, 325, 329, 331
See application file for complete search history.

(56) References Cited

U.S. PATENT DOCUMENTS

| 4,373,018 | A | * | 2/1983 | Reichmanis et al. | .......... 430/312 |
| 4,564,583 | A | * | 1/1986 | Maeguchi | ............ 430/312 |
| 4,567,132 | A | * | 1/1986 | Fredericks et al. | .......... 430/312 |
| 6,455,227 | B1 | * | 9/2002 | Hara | .......................... 430/273.1 |

(Continued)

*Primary Examiner* — Amanda C Walke
(74) *Attorney, Agent, or Firm* — Cooper Legal Group, LLC

(57) ABSTRACT

One or more techniques or systems for controlling a profile for photo resist (PR) are provided herein. In some embodiments, a first shield layer is formed on a first PR layer and a second PR layer is formed on the first shield layer. A first window is formed within the second PR layer during a first exposure with a mask. A second window is formed within the first shield layer based on the first window. A third window is formed within the first PR layer during a second exposure without a mask. Because, the third window is formed while the first shield layer and the second PR layer are on the first PR layer, a profile associated with the first PR layer is controlled. Contamination during ion bombardment is mitigated due to the controlled profile.

20 Claims, 12 Drawing Sheets

(56) References Cited

U.S. PATENT DOCUMENTS

| | | | |
|---|---|---|---|
| 6,844,143 B2 * | 1/2005 | Lin et al. | 430/317 |
| 6,881,524 B2 * | 4/2005 | Cauchi et al. | 430/5 |
| 7,176,066 B2 * | 2/2007 | Brenner et al. | 438/142 |
| 7,767,385 B2 * | 8/2010 | Larson et al. | 430/322 |
| 7,820,343 B2 * | 10/2010 | Waiblinger et al. | 430/5 |
| 7,838,200 B2 * | 11/2010 | Chen et al. | 430/270.1 |
| 7,867,913 B2 * | 1/2011 | Jung | 438/725 |
| 8,053,172 B2 * | 11/2011 | Halle et al. | 430/311 |
| 8,101,338 B2 * | 1/2012 | Ahn | 430/312 |
| 8,415,089 B1 * | 4/2013 | Gupta et al. | 430/311 |
| 8,471,552 B2 * | 6/2013 | Suzuki | 324/207.25 |
| 2004/0217006 A1 * | 11/2004 | Small | 205/98 |
| 2006/0183248 A1 * | 8/2006 | Small | 438/1 |
| 2007/0161251 A1 * | 7/2007 | Tran et al. | 438/725 |
| 2010/0267225 A1 * | 10/2010 | Lee et al. | 438/514 |
| 2011/0039747 A1 * | 2/2011 | Zhou et al. | 510/176 |
| 2012/0028473 A1 * | 2/2012 | Lai et al. | 438/703 |

* cited by examiner

PHOTO RESIST (PR) PROFILE CONTROL

BACKGROUND

Generally, photo resist (PR) is used to mitigate ions from ion bombardment from creating an undesired implant or portion of an implant within a region covered by the PR.

SUMMARY

This summary is provided to introduce a selection of concepts in a simplified form that are further described below within the detailed description. This summary is not intended to be an extensive overview of the claimed subject matter, identify key factors or essential features of the claimed subject matter, nor is it intended to be used to limit the scope of the claimed subject matter.

One or more embodiments of techniques or systems for controlling a profile of a photo resist (PR) structure are provided herein. Generally, a PR structure is used to mitigate ions from forming an implant within a base material during ion bombardment. For example, the PR structure is formed on the base material to shield the base material during ion bombardment. However, when the PR structure is formed, it is often associated with a tapered profile as a result of being formed by photolithography or as a result of the ion bombardment. In other words, the PR structure, or at least a cross-section thereof, is not substantially rectangular. When this occurs, implant quality suffers because ions are implanted in portions of the base material where the ions are not necessarily desired.

In some embodiments, one or more techniques or systems for controlling the profile of the PR structure are provided. For example, a first PR layer is formed on a base material, a first shield layer is formed on the first PR layer and a second PR layer is formed on the first shield layer. A first window is formed within the second PR layer. A second window is formed within the first shield layer based on the first window. A third window is formed within the first PR layer based on the first window. Because the third window is formed within the first PR layer with the first shield layer and the first PR layer above the first PR layer, the first PR layer comprises a substantially rectangular profile. In some embodiments, an implant is formed within the third window and contamination, such as N+ or P+ well leakage, is mitigated because the substantially rectangular profile of the first PR layer mitigates ions from entering undesired locations within the base material.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Embodiments or examples, illustrated within the drawings are disclosed below using specific language. It will nevertheless be understood that the embodiments or examples are not intended to be limiting. Any alterations and modifications within the disclosed embodiments, and any further applications of the principles disclosed in this document are contemplated as would normally occur to one of ordinary skill within the pertinent art.

It will be appreciated that 'layer', as used herein, contemplates a region, and does not necessarily comprise a uniform thickness. For example, a layer is a region, such as an area comprising arbitrary boundaries. A layer is also, for example, a region comprising at least some variation in thickness.

As used herein, the "+" symbol or a plus region is indicative of strong doping, relative to other regions, associated with a conductivity type. For example, N+ is indicative of a strongly doped N type region. Conversely, the "−" symbol or a minus region is indicative of weak doping associated with a conductivity type. For example, P− is indicative of a weakly doped P type region.

Figure 3:
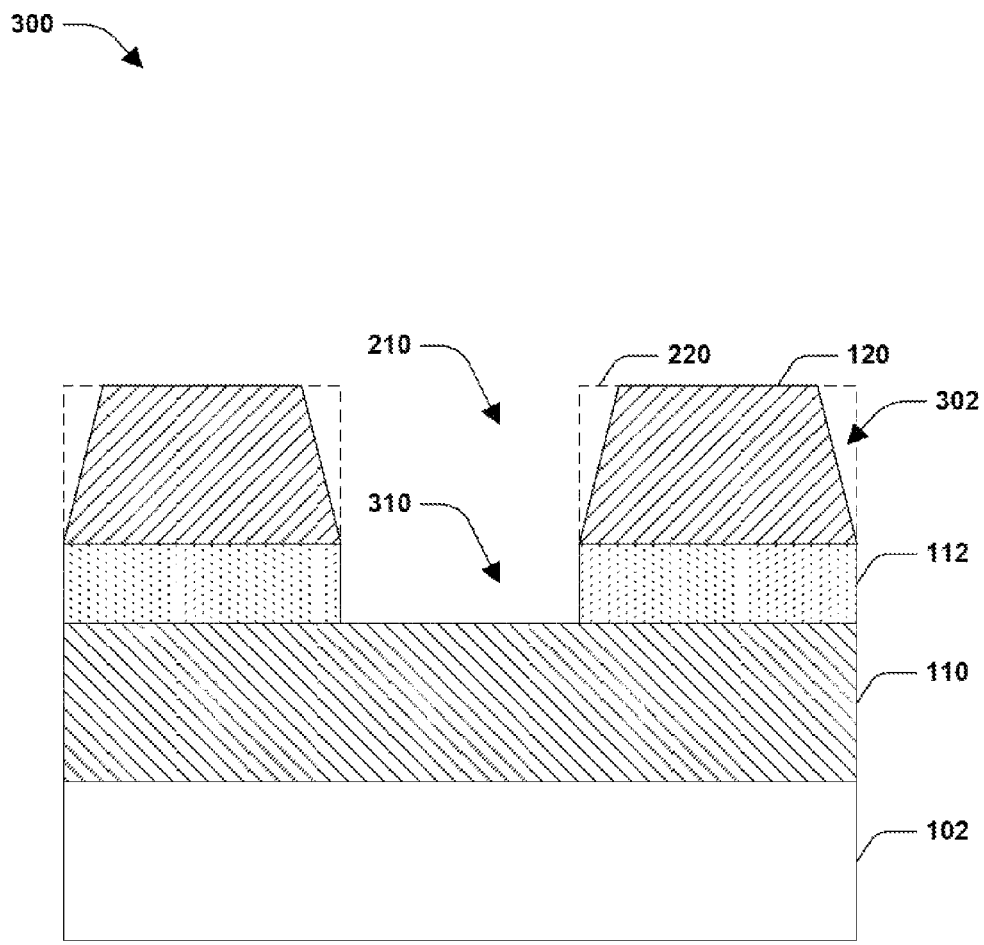
FIG. 3 is a cross-sectional view of a photo resist (PR) structure during an intermediate fabrication stage, according to some embodiments.

It will be appreciated that for some of the figures herein, one or more boundaries, such as boundary 220 of FIG. 3, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable within the figures, and thus are drawn with different dimensions or slightly apart from one another, in some of the figures, so that they are distinguishable from one another. As another example, where a boundary is associated with an irregular shape, the boundary, such as a box drawn with a dashed line, dotted lined, etc., does not necessarily encompass an entire component in some instances. Conversely, a drawn box does not necessarily encompass merely an associated component, in some instances, but encompasses at least a portion of one or more other components as well.

The following figures illustrate formation of a photo resist (PR) structure associated with a controlled profile during intermediate semiconductor fabrication stages, according to some embodiments. It will be appreciated that the respective figures are described with reference to one another, such as with reference to a previous figure, for example.

Figure 1:
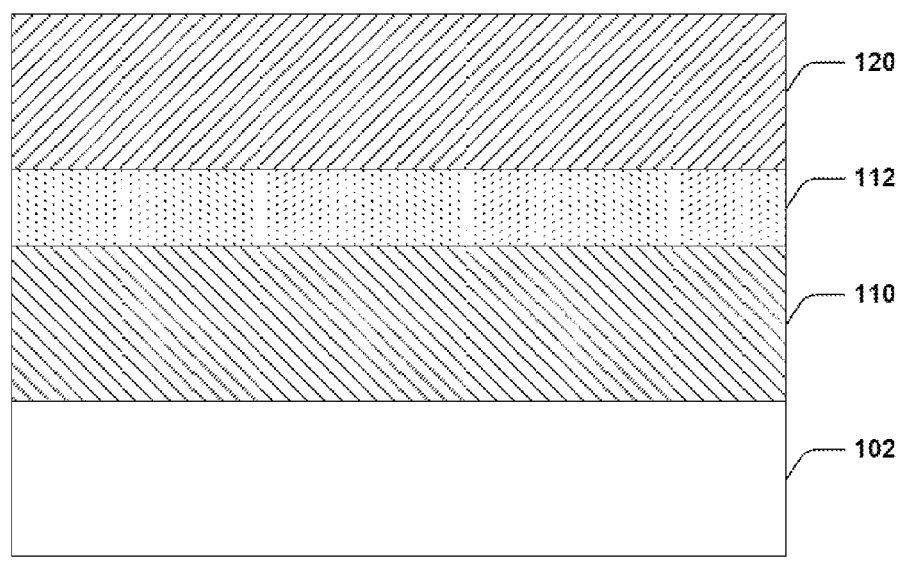
FIG. 1 is a cross-sectional view of a photo resist (PR) structure during an intermediate fabrication stage, according to some embodiments.

FIG. 1 is a cross-sectional view 100 of a photo resist (PR) structure during an intermediate fabrication stage, according to some embodiments. In FIG. 1, a base material is illustrated at 102. The base material comprises silicon, for example. A first PR layer 110 is formed on the base material 102, such as by a spin coating process. Similarly, a first shield layer 112 is formed on the first PR layer 110. Additionally, a second PR layer 120 is formed on the first shield layer 112. In some embodiments, the first shield layer 112 comprises ashing removable dielectric (ARD), SiON, organic PR, etc. The first shield layer 112 and the second PR layer 120 are formed by a spin coating process in some embodiments. In some embodiments, the second PR layer 120 comprises different PR material than material of the first PR layer 110. In other embodiments, the second PR layer 120 and the first PR layer 110 comprise the same PR material.

Figure 2:
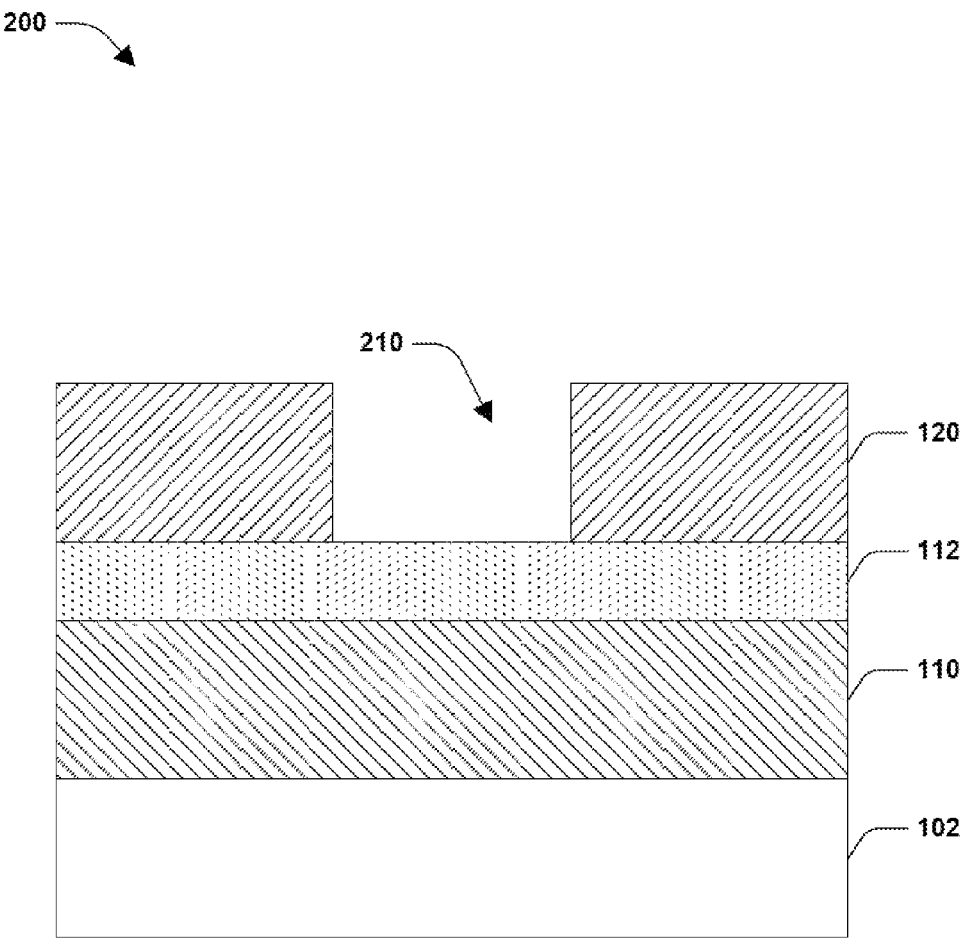
FIG. 2 is a cross-sectional view of a photo resist (PR) structure during an intermediate fabrication stage, according to some embodiments.

FIG. 2 is a cross-sectional view 200 of a photo resist (PR) structure during an intermediate fabrication stage, according to some embodiments. A first window 210 is formed within the second PR layer 120 during a first exposure or developing of the PR structure of FIG. 2 based on a mask and photolithography. It will be appreciated that the first shield layer 112 acts as a hard mask during the first exposure.

FIG. 3 is a cross-sectional view 300 of a photo resist (PR) structure during an intermediate fabrication stage, according to some embodiments. A second window 310 is formed within the first shield layer 112 based on the first window 210 within the second PR layer 120. In some embodiments, the second window 310 is formed based on an etching process. As a result of this, the second PR layer 120 is associated with a tapered profile 302. Boundary 220 indicates an original profile associated with the second PR layer 120. It will be appreciated that the second window 310 has a similar size as the first window 210, because the etching generally tapers the second PR layer 120, rather than the first shield layer 112.

Figure 4:
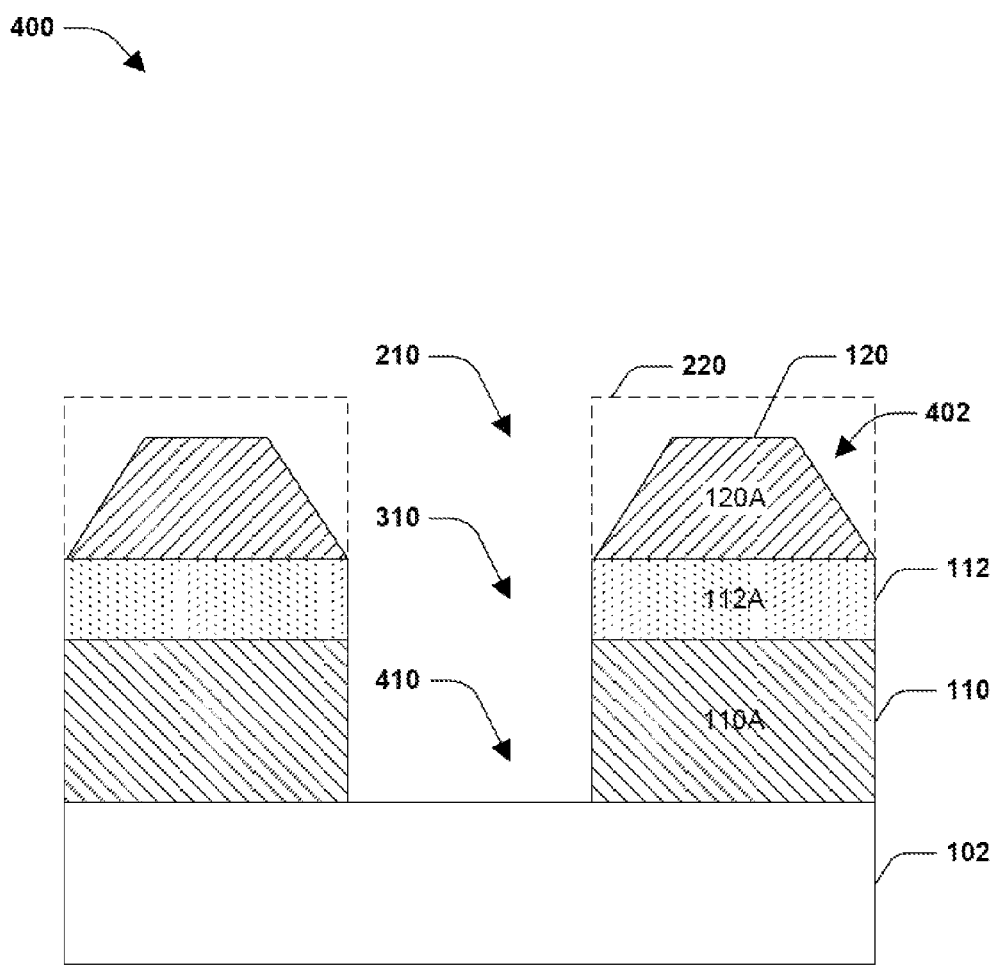
FIG. 4 is a cross-sectional view of a photo resist (PR) structure during an intermediate fabrication stage, according to some embodiments.

FIG. 4 is a cross-sectional view 400 of a photo resist (PR) structure during an intermediate fabrication stage, according to some embodiments. A third window 410 is formed within the first PR layer 110 based on the first window 210 or the second window 310. In some embodiments, the third window 410 is formed based on a second exposure without a mask. Because the first shield layer 112 was etched away, the second exposure based on photolithography removes a portion of the first PR layer 110 not covered by the first shield layer 112 and the second PR layer 120. In other words, a dimension associated with the third window 410 is defined by the first window 210 or the second window 310. It will be appreciated that the second exposure can cause the second PR layer 120 to taper more, resulting in a further tapered profile 402. Again, boundary 220 is indicative of an original profile associated with the second PR layer 120. It will be appreciated that because window 410 is formed while the first shield layer 112 and the second PR layer 120 are above the first PR layer 110, the first PR layer 110 maintains a substantially rectangular or a substantially vertical profile where window 410 is removed.

It will be appreciated that the second PR layer 120 comprises a second PR region 120A. Similarly, the first shield layer 112 comprises a first shield region 112A and the first PR layer 110 comprises a first PR region 110A. It is seen that the first PR region 110A is on a substrate, such as a base material 102, the first shield region 112A is on the first PR region 110A, and the second PR region 120A is on the first shield region 112A. In some embodiments, the first shield region 112A comprises ashing removable dielectric (ARD), SiON, or organic PR. In some embodiments, the second PR region 120A comprises different PR material than that of the first PR region 110A.

Figure 5:
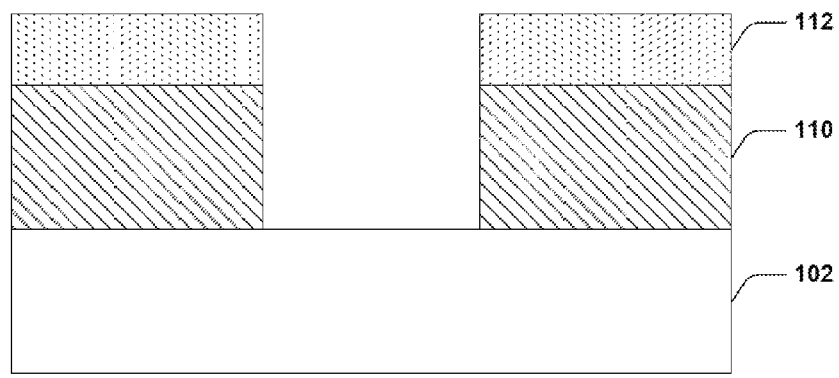
FIG. 5 is a cross-sectional view of a photo resist (PR) structure during an intermediate fabrication stage, according to some embodiments.

FIG. 5 is a cross-sectional view 500 of a photo resist (PR) structure during an intermediate fabrication stage, according to some embodiments. In some embodiments, at least some of the second PR layer 120 is removed such that a first PR layer 110 and a first shield layer 112 remain and are associated with substantially vertical or substantially rectangular profiles. For example, PR ashing is used to remove at least some of the second PR layer 120.

Figure 6:
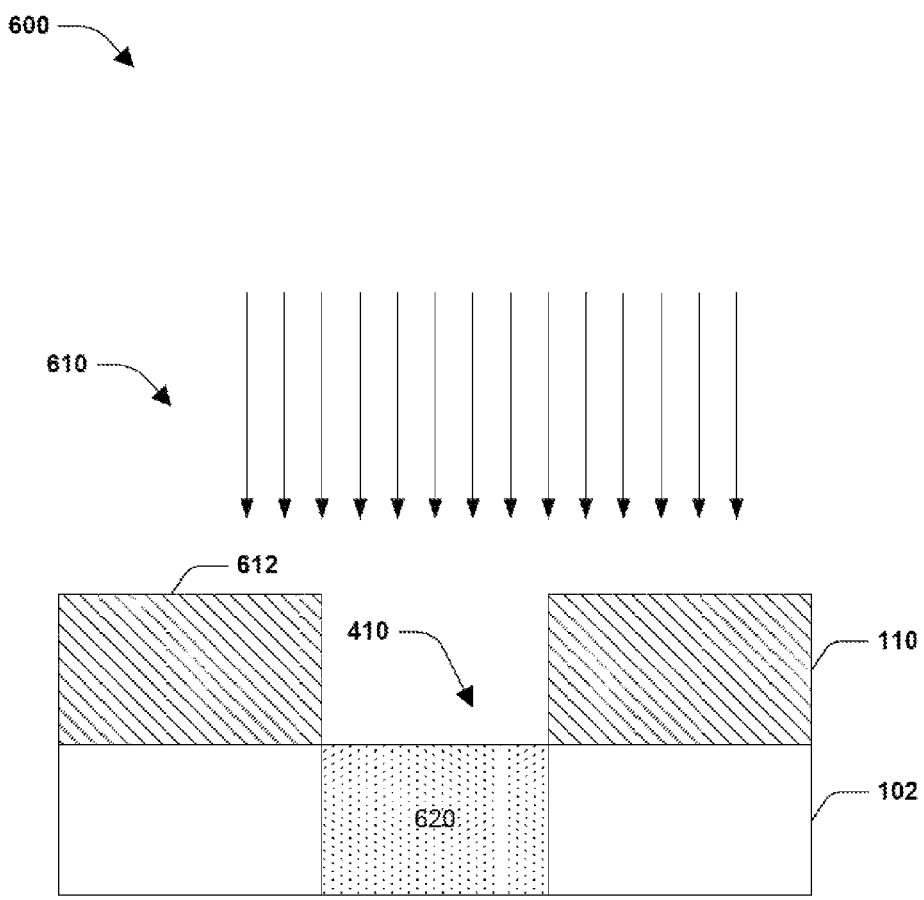
FIG. 6 is a cross-sectional view of a photo resist (PR) structure during an intermediate fabrication stage, according to some embodiments.

FIG. 6 is a cross-sectional view 600 of a photo resist (PR) structure during an intermediate fabrication stage, according to some embodiments. In some embodiments, at least some of the first shield layer 112 is removed such that the first PR layer 110 associated with a substantially vertical or substantially rectangular profile remains. For example, peroxymonosulfuric acid is used to remove at least some of the first shield layer 112. Additionally, ion bombardment 610 is performed to form an implant 620 below the third window 410. In this way, ions from the ion bombardment 610 are mitigated from reaching areas covered by the first PR layer 110. It will be appreciated that a portion or some of the first PR layer 110 is removed to facilitate ion bombardment in some embodiments. For example, when a larger implant is desired, 612 is removed and ion bombardment 610 is performed to create an implant for areas of the base material 102 previously covered by 612.

Figure 7:
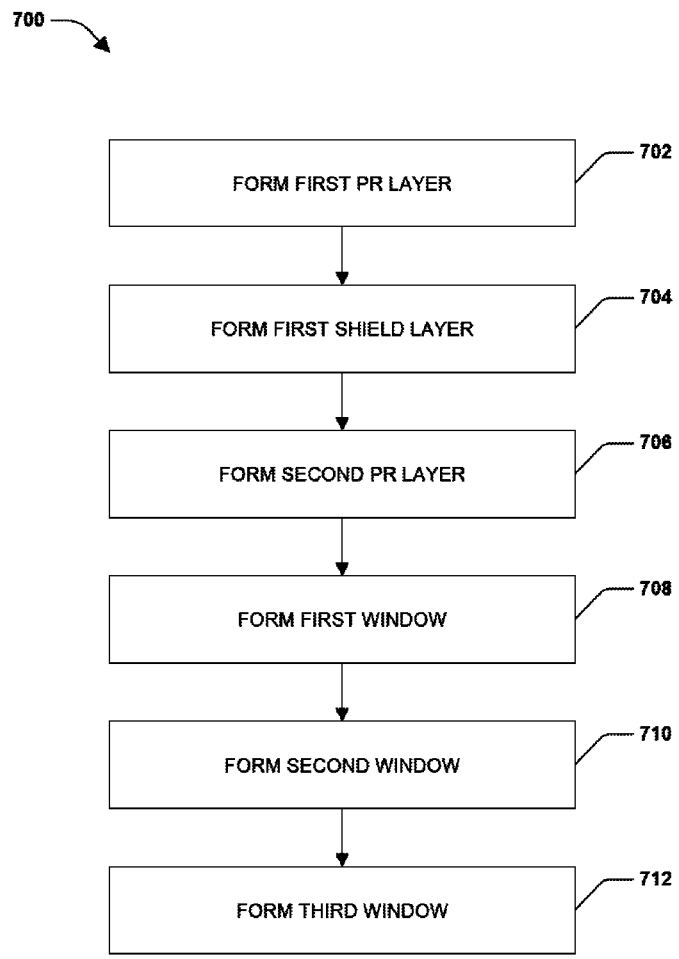
FIG. 7 is a flow diagram of a method for controlling a profile of a photo resist (PR) structure, according to some embodiments.

FIG. 7 is a flow diagram of a method 700 for controlling a profile of a photo resist (PR) structure, according to some embodiments. At 702, a first PR layer is formed on a base material. At 704, a first shield layer is formed on the first PR layer. At 706, a second PR layer is formed on the first shield layer. At 708, a first window is formed within the second PR layer. At 710, a second window is formed within the first shield layer based on the first window. At 712, a third window is formed within the first PR layer based on the second window, thereby controlling a profile associated with the first PR layer.

Figure 8:
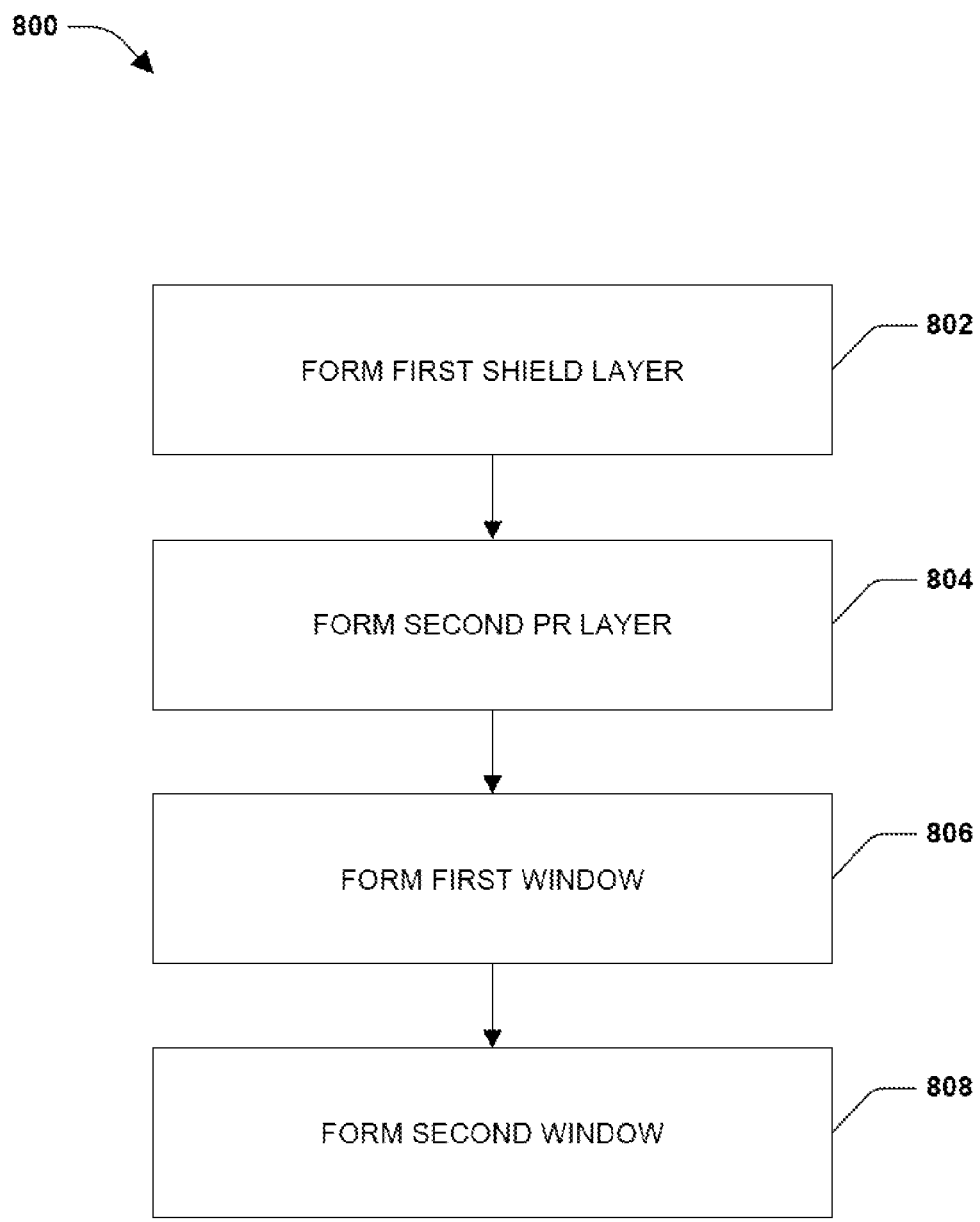
FIG. 8 is a flow diagram of a method for controlling a profile of a photo resist (PR) structure, according to some embodiments.

FIG. 8 is a flow diagram of a method 800 for controlling a profile of a photo resist (PR) structure, according to some embodiments. At 802, a first shield layer is formed on a base material. At 804, a second PR layer is formed on the first shield layer. At 806, a first window is formed within the second PR layer. At 808, a second window is formed within the first shield layer based on the first window, thereby controlling a profile associated with the first shield layer.

Figure 9:
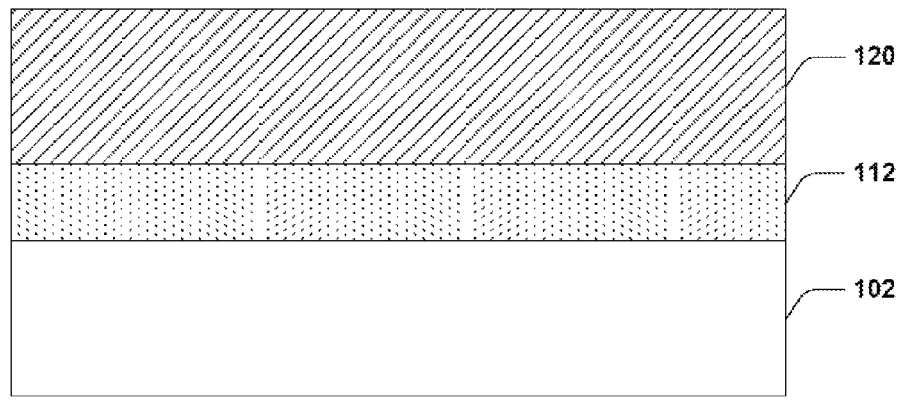
FIG. 9 is a cross-sectional view of a photo resist (PR) structure during an intermediate fabrication stage, according to some embodiments.

It will be appreciated that FIG. 9-FIG. 12 are similar to FIG. 1-FIG. 6, except that no first PR layer 110 is formed between the base material 102 and the first shield layer 112. Accordingly, FIG. 9 is a cross-sectional view 900 of a photo resist (PR) structure during an intermediate fabrication stage, according to some embodiments. A first shield layer 112 is formed on a base material 102 and a second PR layer 120 is formed on the first shield layer 112. In some embodiments, the first shield layer 112 comprises ashing removable dielectric (ARD), SiON, organic PR, etc. The first shield layer 112 and the second PR layer 120 are formed by spin coating according to some embodiments.

Figure 10:
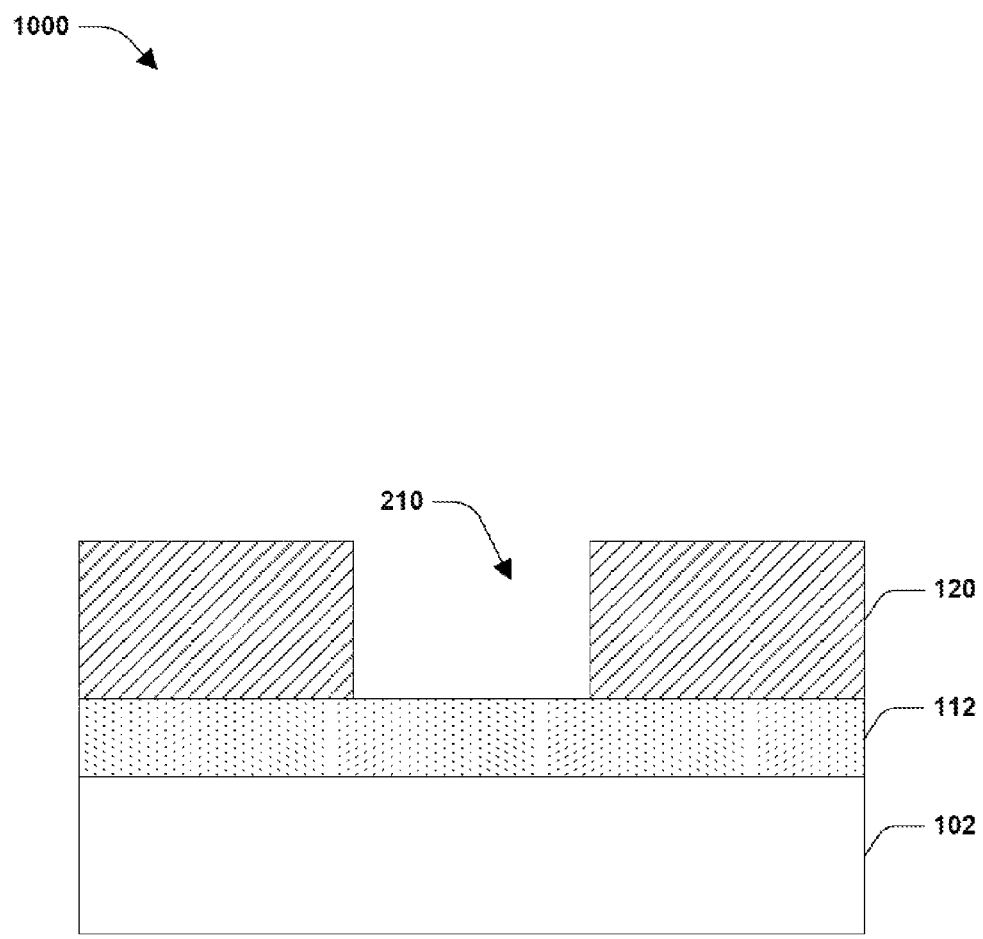
FIG. 10 is a cross-sectional view of a photo resist (PR) structure during an intermediate fabrication stage, according to some embodiments.

FIG. 10 is a cross-sectional view 1000 of a photo resist (PR) structure during an intermediate fabrication stage, according to some embodiments. A first window 210 is formed within the second PR layer 120 based on a mask and a first exposure using photolithography.

Figure 11:
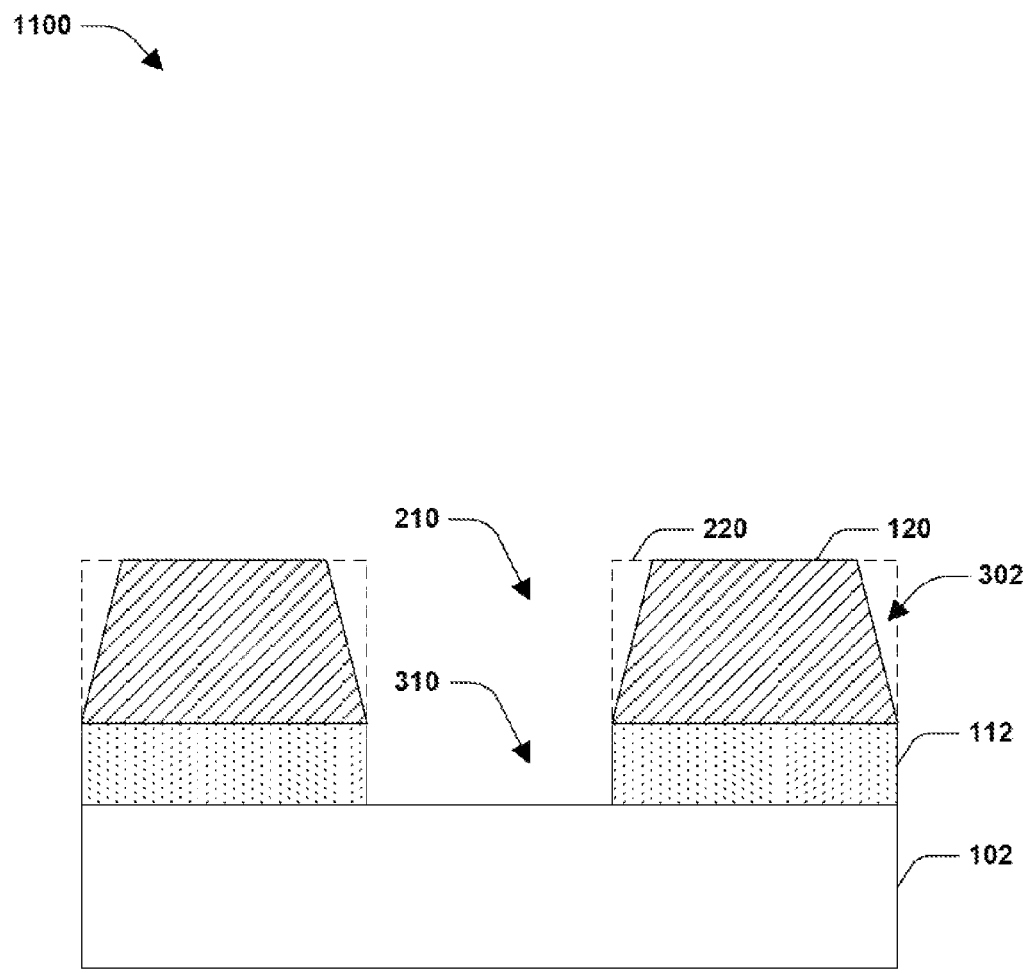
FIG. 11 is a cross-sectional view of a photo resist (PR) structure during an intermediate fabrication stage, according to some embodiments.

FIG. 11 is a cross-sectional view 1100 of a photo resist (PR) structure during an intermediate fabrication stage, according to some embodiments. A second window 310 is formed within the first shield layer 112 based on the first window 210. In some embodiments, the second window 310 is formed based on etching. As a result of the etching, the second PR layer 120 becomes associated with a tapered profile 302.

Figure 12:
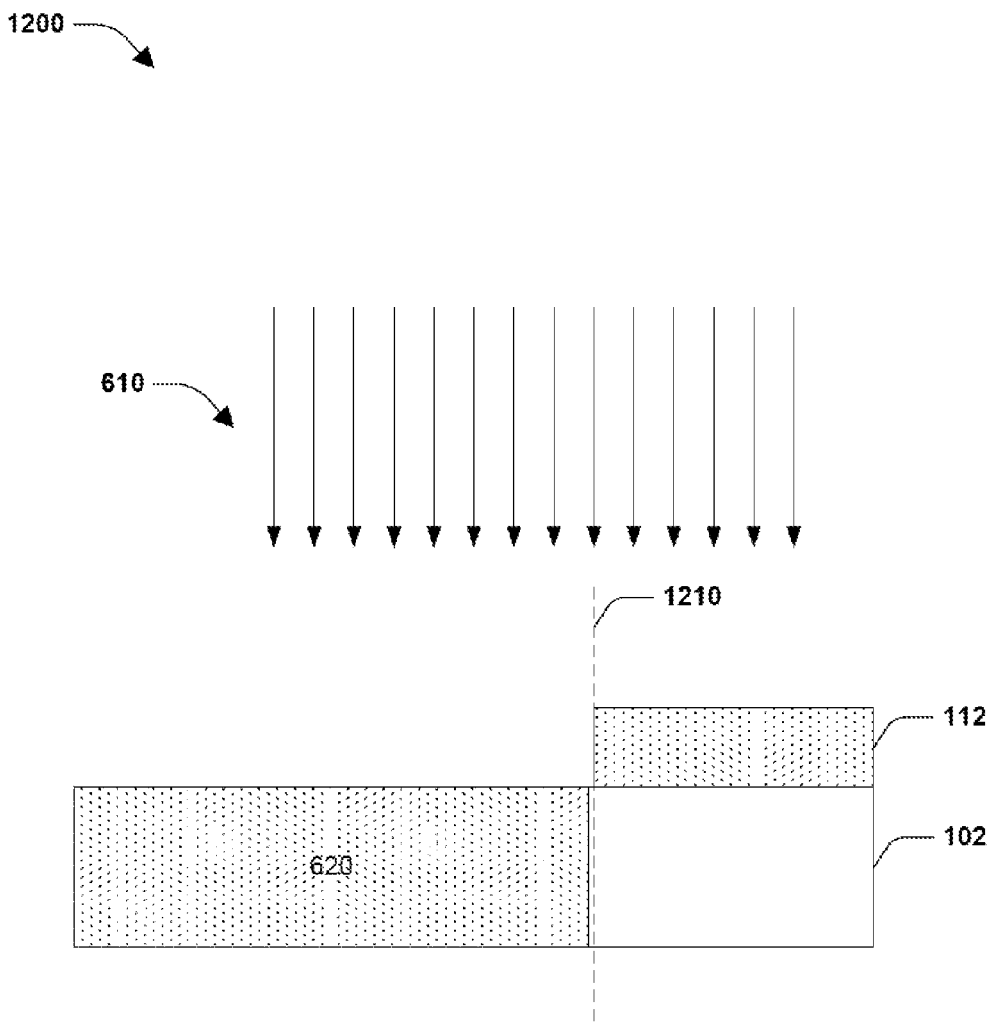
FIG. 12 is a cross-sectional view of a photo resist (PR) structure during an intermediate fabrication stage, according to some embodiments.

FIG. 12 is a cross-sectional view 1200 of a photo resist (PR) structure during an intermediate fabrication stage, according to some embodiments. In some embodiments, the second PR layer 120 is removed, such as by PR ashing. In some embodiments, the second PR layer 120 is not removed (not shown), and remains on the first shield layer 112. Ion bombardment is used to form an implant 620 within the base material 102 in areas not covered by the first shield layer 112, such as on one side of boundary 1210, such as where at least some of the first shield layer 112 is removed from the base material 102 on the other side of the boundary 1210. After ion bombardment 610, the first shield layer 112 is removed using PR ashing or a Caro clean, such as with peroxymonosulfuric acid.

According to some aspects, a method for controlling a profile of photo resist (PR) structure is provided, comprising forming a first photo resist (PR) layer on a base material. The method comprises forming a first shield layer on the first PR layer. The method comprises forming a second PR layer on the first shield layer. The method comprises forming a first window within the second PR layer. The method comprises forming a second window within the first shield layer based on the first window within the second PR layer. The method comprises forming a third window within the first PR layer based on the first window within the second PR layer, thereby controlling a profile associated with the first PR layer.

According to some aspects, a method for controlling a profile for a photo resist (PR) structure is provided, comprising forming a first shield layer on a base material. The method comprises forming a second PR layer on the first shield layer. The method comprises forming a first window within the second PR layer. The method comprises forming a second window within the first shield layer based on the first window within the second PR layer, thereby controlling a profile associated with the first shield layer.

According to some aspects, a photo resist (PR) structure with a substantially vertical profile is provided, comprising a first photo resist (PR) region, a first shield region on the first PR region, and a second PR region on the first shield region.

Although the subject matter has been described in language specific to structural features or methodological acts, it is to be understood that the subject matter of the appended claims is not necessarily limited to the specific features or acts described above. Rather, the specific features and acts described above are disclosed as exemplary embodiments.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the first photo resist (PR) layer, the second PR layer, the first shield layer, the first window, the second window, the third window, the first PR region, the first shield region, the second PR region, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, such as spin coating, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD).

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A method, comprising:
   forming a first photo resist (PR) layer on a base material;
   forming a first shield layer on the first PR layer;
   forming a second PR layer on the first shield layer;
   forming a first window within the second PR layer;
   forming a second window within the first shield layer based on the first window within the second PR layer; and
   forming a third window within the first PR layer based on the second window within the second PR layer to expose a portion of the base material; and
   doping the portion of the base material.

2. The method of claim 1, comprising removing at least some of the second PR layer remaining after the first window is formed.

3. The method of claim 2, comprising removing at least some of the first shield layer remaining after the second window is formed.

4. The method of claim 3, comprising removing at least some of the first PR layer remaining after the third window is formed.

5. The method of claim 1, comprising forming an implant within the base material based on ion bombardment during the doping.

6. The method of claim 1, comprising forming the first shield layer of at least one of ashing removable dielectric (ARD), SiON, or organic PR.

7. The method of claim 1, comprising forming the first window within the second PR layer based on a first exposure with a mask.

8. The method of claim 1, comprising forming the third window within the first PR layer based on a second exposure without a mask.

9. The method of claim 1, comprising forming the base material of silicon.

10. The method of claim 1, the forming a first window within the second PR layer comprising:
    tapering an edge of the second PR defining the first window.

11. A method, comprising:
    forming a first shield layer on a base material;
    forming a second PR layer on the first shield layer;
    forming a first window within the second PR layer, the first window defined by a tapered sidewall of the second PR layer; and
    forming a second window within the first shield layer based on the first window within the second PR layer, thereby controlling a profile associated with the first shield layer.

12. The method of claim 11, comprising removing at least some of the second PR layer remaining after the first window is formed.

13. The method of claim 11, comprising forming an implant within the base material based on ion bombardment.

14. The method of claim 11, comprising removing at least some of the first shield layer using peroxymonosulfuric acid to form the second window.

15. The method of claim 11, comprising forming the first shield layer of at least one of ashing removable dielectric (ARD), SiON, or organic PR.

16. The method of claim 11, comprising forming the first window within the second PR layer based on a first exposure with a mask.

17. The method of claim 11, comprising forming the base material of silicon.

18. A photo resist (PR) structure with a substantially vertical profile, comprising:
    a first photo resist (PR) region;
    a first shield region on the first PR region;
    a second PR region on the first shield region; and
    a base material having a doped region formed within a portion of the base material exposed through a window of the first PR region, the first shield region, and the second PR region.

19. The photo resist (PR) structure of claim 18, the first shield region comprising at least one of ashing removable dielectric (ARD), SiON, or organic PR.

20. The photo resist (PR) structure of claim 18, the second PR region comprising different PR material than PR material of the first PR region.

* * * * *